(12) United States Patent
Ma et al.

(10) Patent No.: US 10,680,410 B2
(45) Date of Patent: Jun. 9, 2020

(54) EXTERNAL CAVITY LASER

(71) Applicant: Elenion Technologies, LLC, New York, NY (US)

(72) Inventors: Yangjin Ma, Brooklyn, NY (US); Yang Liu, Elmhurst, NY (US); Ruizhi Shi, New York, NY (US); Thomas Wetteland Baehr-Jones, Arcadia, CA (US); Saeed Fathololoumi, San Gabriel, CA (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 16/665,206

(22) Filed: Oct. 28, 2019

(65) Prior Publication Data

US 2020/0067276 A1 Feb. 27, 2020

Related U.S. Application Data

(63) Continuation of application No. 15/855,328, filed on Dec. 27, 2017, now Pat. No. 10,530,126.

(51) Int. Cl.
| | |
|---|---|
| *H01S 5/14* | (2006.01) |
| *H01S 5/068* | (2006.01) |
| *H01S 3/083* | (2006.01) |
| *H01S 5/10* | (2006.01) |
| *H01S 3/13* | (2006.01) |

(Continued)

(52) U.S. Cl.
CPC .............. *H01S 5/141* (2013.01); *H01S 3/083* (2013.01); *H01S 3/1307* (2013.01); *H01S 5/021* (2013.01); *H01S 5/06821* (2013.01); *H01S 5/1003* (2013.01); *H01S 5/1014* (2013.01); *H01S 5/1025* (2013.01); *H01S 5/142* (2013.01); *H01S 3/106* (2013.01); *H01S 5/0287* (2013.01);

(Continued)

(58) Field of Classification Search
CPC ...... H01S 5/141; H01S 5/1025; H01S 5/1003; H01S 5/021; H01S 3/1307; H01S 5/1014; H01S 5/0287; H01S 5/06821; H01S 3/083; H01S 5/4025
See application file for complete search history.

(56) References Cited

U.S. PATENT DOCUMENTS 9,768,587 B1 * 9/2017 Zheng .................... H01S 5/1092
9,780,524 B1 * 10/2017 Zheng ................... H01S 5/3013

(Continued)

*Primary Examiner* — Yuanda Zhang
(74) *Attorney, Agent, or Firm* — Stratford Managers Corporation

(57) ABSTRACT

Practical silicon-based light sources are still missing, despite the progress in germanium lasers, because both silicon and germanium are indirect-band semiconductors and inefficient at light generation. A tunable and single mode external cavity laser comprising: a gain medium for generating light between a reflective surface at one end of the gain medium; and a wavelength selective reflector at the other end of a laser cavity. A splitter disposed in the laser cavity includes an input port optically coupled to the gain medium, an input/output port optically coupled to the wavelength selective reflector, and an output port for outputting laser light at selected wavelengths. The wavelength selective reflector reflects light of one or more selected periodic wavelengths back to the gain medium via the input/output port, and passes light of non-selected wavelengths out of the laser cavity.

20 Claims, 7 Drawing Sheets

(51) Int. Cl.
*H01S 5/02* (2006.01)
*H01S 5/40* (2006.01)
*H01S 5/028* (2006.01)
*H01S 3/106* (2006.01)

(52) U.S. Cl.
CPC .......... *H01S 5/4025* (2013.01); *H01S 5/4062* (2013.01); *H01S 5/4087* (2013.01)

(56) References Cited

U.S. PATENT DOCUMENTS

| | | | |
|---|---|---|---|
| 9,871,346 B1* | 1/2018 | Lee | H01S 3/105 |
| 9,939,663 B2* | 4/2018 | Luo | G02F 1/011 |
| 2009/0122817 A1* | 5/2009 | Sato | G02B 6/12007 |
| | | | 372/20 |
| 2015/0222089 A1* | 8/2015 | Jeong | H01S 5/142 |
| | | | 359/346 |
| 2017/0139237 A1* | 5/2017 | Luo | G02F 1/011 |
| 2017/0324218 A1* | 11/2017 | Krishnamoorthy | H01S 3/0637 |
| 2017/0353008 A1* | 12/2017 | Sugiyama | H01S 5/101 |

* cited by examiner

Fig. 7. (a) Reflected spectra of the Vernier ring, normalized to the maximum power of the reflected spectra. The red line is the simulated spectrum, while the red dots are the measured spectrum. (b) Reflected spectra of R1 (red) and R2 (blue). The solid lines are the simulated spectrums, and the red dots are measured spectrums.

EXTERNAL CAVITY LASER

CROSS-REFERENCE TO RELATED APPLICATIONS

This application is a continuation of and claims priority to U.S. patent application Ser. No. 15/855,328, filed Dec. 27, 2017, now allowed.

TECHNICAL FIELD

The present invention relates to an external cavity laser, and in particular to an external cavity laser for use in semiconductor photonics.

BACKGROUND

Semiconductor lasers and optical amplifiers are preferred in transceivers because they are efficiently electrically pumped and the die size is small. Lasing is a radiative recombination process in semiconductors, in which an electron in the conduction recombines with a hole in the valance band and a photon is emitted. The reverse process is electron hole pair generation through optical absorption, which occurs in such devices as photodetectors and solar cells.

Semiconductor, e.g. Silicon, photonics is widely seen as an enabling technology to address the exponentially increasing demand for data communication bandwidth. Lasers, in particular single mode and tunable lasers, are critical components in data transmission systems. Two fundamental elements of a laser include a gain medium and a resonating cavity. Due to the indirect bandgap of silicon, several approaches for introducing gain medium into the photonic integration material system have been disclosed, including edge coupled bonding, direct bonding, heavily N-doped germanium, and quantum dot structures. Single mode laser cavities are typically constructed with Distributed Bragg Reflectors (DBRs), which require high lithography resolution and which are sensitive to fabrication variations.

Practical semiconductor-based, e.g. silicon, light sources have still not been discovered, despite the progress in germanium lasers, because both silicon and germanium are indirect-band semiconductors and inefficient at light generation. Accordingly, this situation has propelled the study of group III/V-based laser integration onto a semiconductor, e.g. silicon or silicon-on insulator (SOI), platform.

An object of the present invention is to overcome the shortcomings of the prior art by providing an external cavity laser for integrated semiconductor photonics.

SUMMARY OF THE INVENTION

Accordingly, the present invention relates to an external cavity laser comprising:

a gain medium for generating light;

a reflector at one end of the gain medium;

a splitter including an input port optically coupled to the gain medium, an input/output port, and an output port for outputting laser light at selected wavelengths;

a wavelength selective reflector optically coupled to the input/output port for reflecting light of one or more selected wavelengths back to the gain medium via the input/output port forming a laser cavity with the reflective surface, and passing light of non-selected wavelengths.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
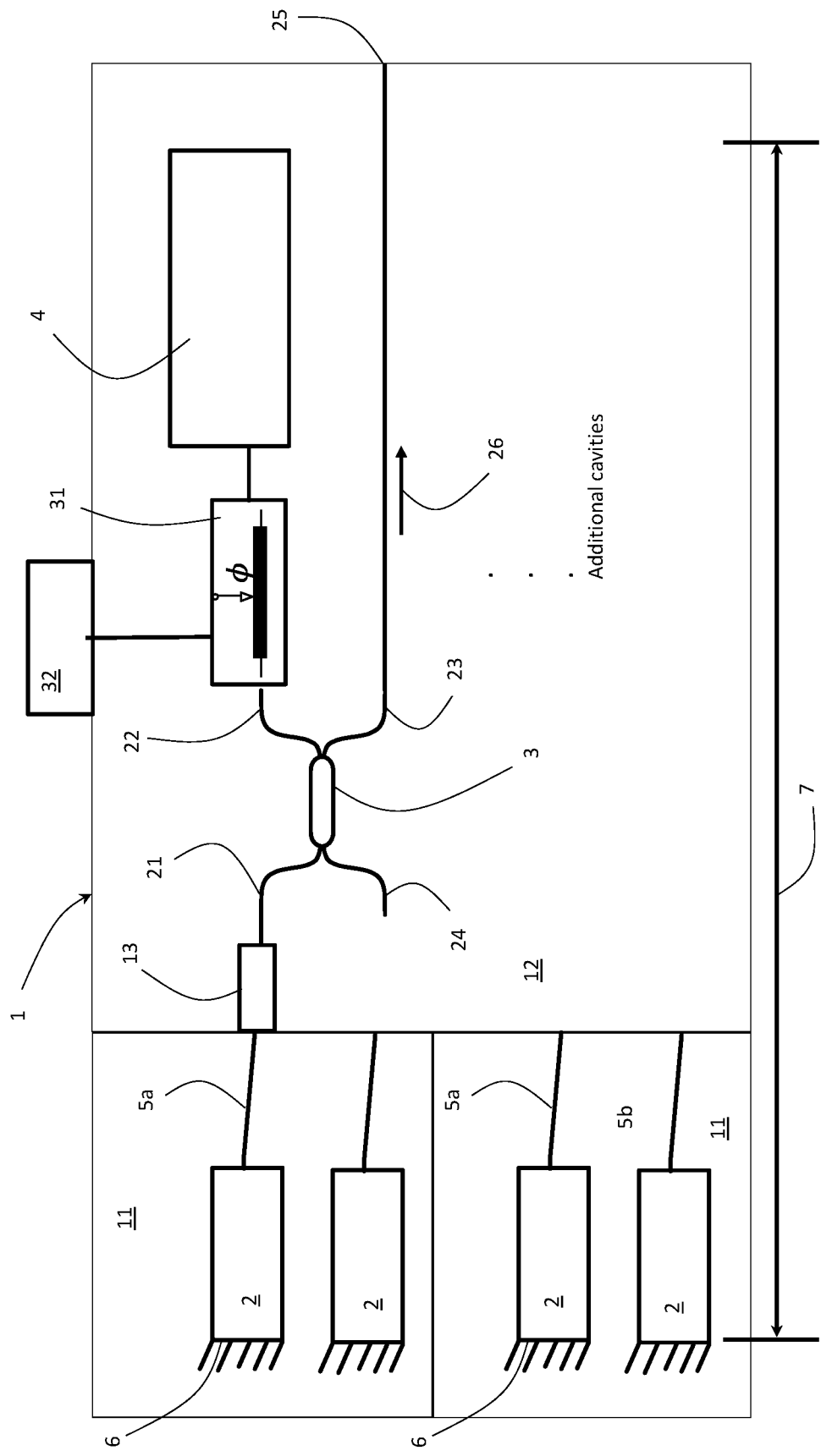
FIG. 1 is a schematic view in accordance with an embodiment of the present invention.

With reference to FIG. 1, an external cavity laser (ECL) 1 of an embodiment of the present invention includes a gain medium 2, a splitter 3 and a wavelength selective reflector 4. A reflector, e.g. a reflective surface 6, is provided on or adjacent to the gain medium 2, and the wavelength selective reflector 4 form a laser cavity 7.

Figure 2:
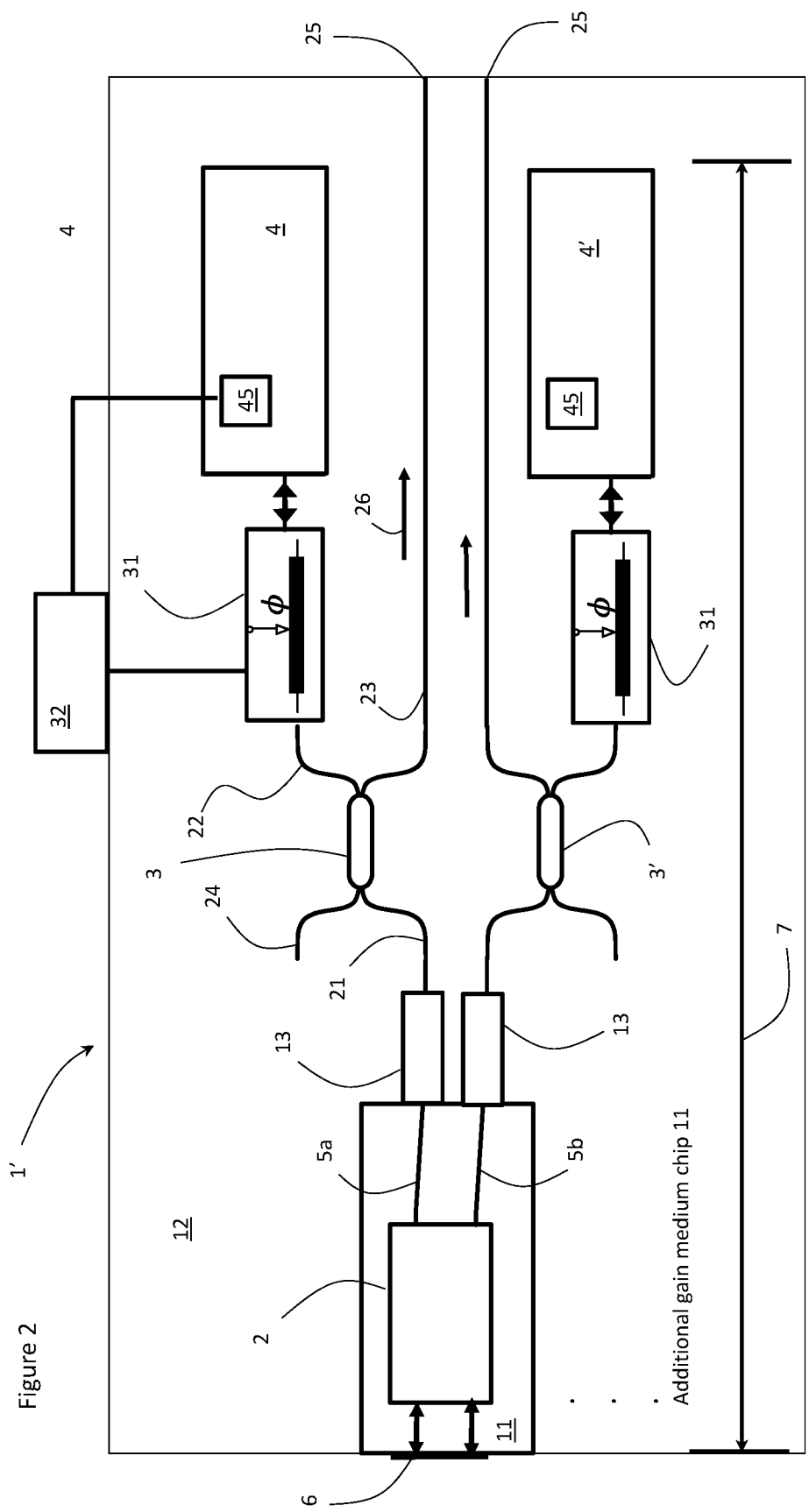
FIG. 2 is a schematic view of an alternative embodiment of the present invention.

The gain medium 2 may comprise any suitable material, e.g. a III-V gain chip such as InP, in particular a reflective semiconductor optical amplifier (RSOA), which may be based on bulk, quantum well or quantum dot material. The gain medium 2 may be provided on a first chip 11 with the remaining elements, i.e. the splitter 3 and the wavelength selective reflector (WSR) 4 provided on a separate photonic chip 12, as illustrated in FIG. 1. In another embodiment, an array of separate gain mediums 2, may be provided on a single gain chip 11, and an array of the remaining elements, e.g. splitter 3 and WSR 4, may be provided on a single photonic chip 12, which when coupled together form an array of lasers 1. In another embodiment, an array of separate gain mediums 2, i.e. for generating a plurality of different wavelengths, may be provided on a plurality of gain chips 11, all of which are fixed to the single photonic chip 12 with a plurality of splitters 3 and WSR 4. The photonic chip 12 may include a separate substrate with a semiconductor, e.g. Silicon, device layer formed thereon. Ideally the photonic chip comprises a Silicon on Insulator (SOI) structure including an upper silicon device layer, a middle silicon dioxide cladding layer, and a bottom silicon substrate. The advantage of this arrangement is that electrical controls on the photonic chip 12 may control the properties of the external cavity laser 1, e.g. wavelength. Alternatively, as illustrated in FIG. 2, the gain medium chip 11, e.g. a RSOA, of an external cavity laser 1' may also be placed, e.g. flip-chip bonded, onto the photonic chip 12 to form an external cavity defined in a device layer formed thereon. Additional gain medium chips 11 may also be placed into a separate pit in the device layer for coupling with additional splitters 3 and WSR 4, as described herein. Accordingly, the gain medium 2 is embedded within the semiconductor photonic chip 12, enabling the optical cavity 7 and waveguides to be defined in either the photonic chip (SOI) material or the gain medium material (InP). During fabrication, a pit may be etched from the device layer down to the substrate, followed by epitaxial growth of the gain medium 2 within the pit. The cladding (oxide) layer may be removed from the photonic chip 11 in order to improve the thermal conductivity between the gain medium chip 11 and the substrate, and to match the height of the gain medium 2 with the semiconductor device layer. The gain medium chip 11 may be bonded to electrical contacts (metal or doped semiconductor), which are connected to metal terminals for connecting with external control and/or power.

The reflective surface 6 may be comprised of a reflective surface on the RSOA, a reflective surface or coating in the pit housing the gain medium 2, or on a surface or coating of the first chip 11 or the photonic chip 12, such as an outer edge of the photonic chip 12, as illustrated in FIG. 2. The reflector may also comprise an alternate optical reflector, e.g. a grating, ring resonator, or some other wavelength filter element. Any combination of chip arrangement 11/12 and reflective surface 6 is possible. One or more output waveguides, e.g. channels 5a and 5b, from the gain medium 2 may be angled at a small acute angle to a normal from the output facet of the gain medium 2, e.g. by 5° to 15°, ideally by 9°, and include an antireflection coating to reduce the back reflection at the output facet. Each output waveguide, e.g. channels 5a and 5b, may be optically coupled to a different splitter 3' and wavelength selective reflector 4' similar to an including the same elements as the ones described hereinbefore and hereinafter. A particular application for a dual channel embodiment, illustrated in FIG. 2, is as a transmitter and a local oscillator in a coherent transceiver.

Typically, an optical coupler 13 is provided for coupling the light between the gain medium 2, in particular from the first chip 11, and the device layer on the photonic chip 12, in particular the splitter 3. Due to the large mode mismatch between the waveguides 5a and 5b from the gain medium 2 and the waveguide in the device layer of the photonic chip 12, e.g. input port 21, the optical coupler 13 may comprise an optical spot-size converter (SSC) 13, which may be provided in the device layer of the photonic chip 12 to reduce the coupling loss between the gain medium 2 and the photonic chip 12. Alternatively or in addition, the waveguide 5 may include a tapering width and or height for expanding the mode reentering the gain medium 2 and for contracting the mode leaving the first chip 11.

Figure 3:
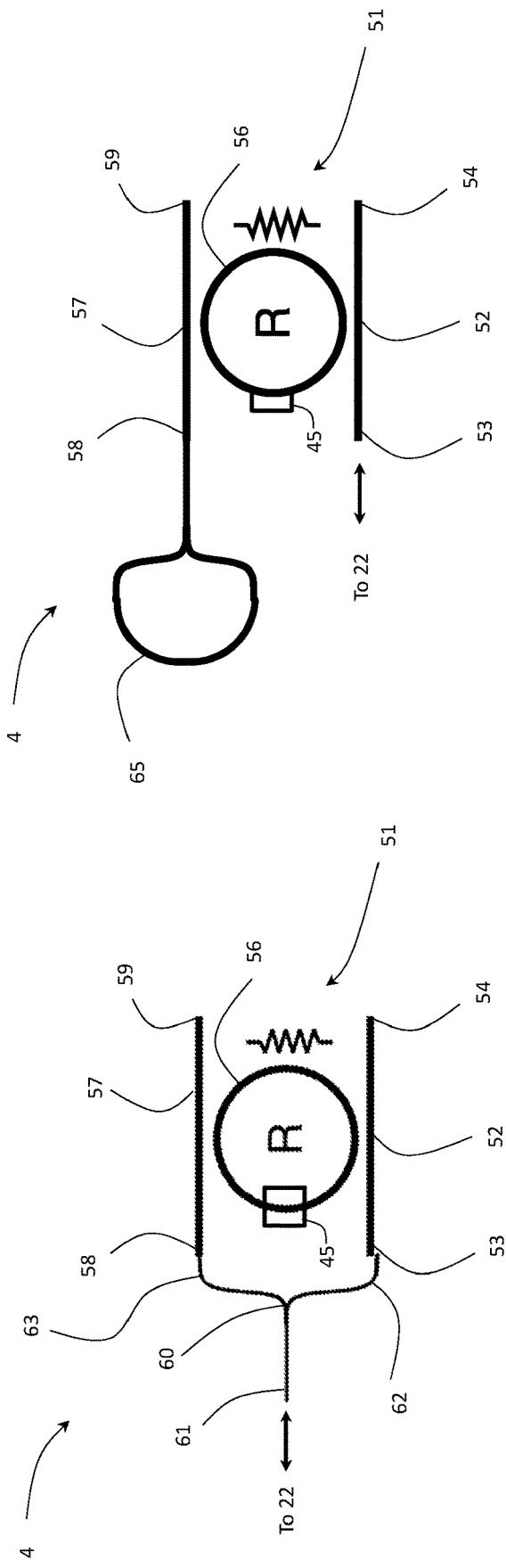
FIG. 3a is a schematic view of an embodiment of a wavelength selective reflector in accordance with the device of FIG. 1 or 2.
FIG. 3b is a schematic view of an embodiment of a wavelength selective reflector in accordance with the device of FIG. 1 or 2.

The optical splitter 3 includes a first port 21 optically coupled to the gain medium 2, e.g. via the optical coupler 13, and a second port 22 optically coupled to the wavelength selective reflector 4 providing an input/output port for transmitting and receiving light to and from the wavelength selective reflector 4. A third port 23 provides an output port for the ECL 1, which may be optically coupled to additional optical elements in the device layer of the photonic chip 12 and/or to an edge of the photonic chip 12, e.g. laser output port 25, for outputting a laser signal 26 to an external waveguide. A fourth port 24 may be provided for monitoring and laser control purposes, as hereinafter described with reference to FIG. 3. The terms optically coupled or coupled are intended to mean connected for the sake of transmitting light therebetween, typically directly connected or utilizing some form of waveguide structure, e.g. integrated waveguides in the device layer, with or without some other intermediate optical element. The optical coupler 3, e.g. a directional coupler (DC), may be connected to the SSC 13 in order to split a first percentage, e.g. 25%-50%, ideally 35%-40%, of the power to the laser output port 26, and a second percentage, e.g. 50%-75%, ideally, 60%-65% (or −2 dB) to the wavelength selective reflector 4. The coupling ratio may be optimized to trade for higher laser power.

One of more phase tuning sections 31 may be provided somewhere in the optical cavity 7, ideally between the optical splitter 3 and the wavelength selective reflector 4, as illustrated in FIGS. 1 and 2. The phase tuning section 31 may comprise any form of suitable phase tuning device, e.g. thermo-optic, electro-optic etc. The phase tuning section 31 may be controlled by an external controller 32 to control effective optical length of the optical cavity 7, thereby control the wavelength of the output laser signal 26, and to get aligned with the wavelength selective reflector 4.

With reference to FIGS. 3a and 3b, the wavelength selective reflector 4 may comprise a comb filter, such as a ring resonator 51, with a first FSR for passing a first set of periodic wavelengths. The ring resonator 51 may comprise a conventional single ring resonator, a multiring resonator and/or a coiled racetrack resonator to minimize area and thermal effects. The ring resonator 51 includes a input waveguide 52 with an input port 53 and a first through port 54. At least one closed loop waveguide 56 is coupled to the input waveguide 52. An output or bus waveguide 57 is coupled to an opposite side of the loop waveguide 56, and includes a drop port 58 and a second through port 59. When light of the resonant wavelength is passed through the dosed loop waveguide 56 from the input waveguide 52, it builds up in intensity over multiple round-trips due to constructive interference and is output to the output waveguide 57, which serves as a detector waveguide. Because only a select few wavelengths will be at resonance within the dosed loop waveguide 56, the optical ring resonator 51 functions as a filter for selected periodic wavelengths, with the light of the non-selected wavelengths exiting the first through port 54.

For a single ring resonator the optical path length difference (OPD) equals:

$$OPD = 2\pi r n_{eff}$$

Wherein r is the radius of the closed loop waveguide 56 and $n_{eff}$ is the effective index of refraction of the waveguide material making up the closed loop waveguide 56. For resonance to take place in the closed loop waveguide 56, the following resonant condition must be satisfied:

$$OPD = m\lambda_m$$

Where $\lambda_m$ is the resonant wavelength, and m is the mode number of the ring resonator 51. Accordingly, in order for light to interfere constructively inside the closed loop waveguide 56, the circumference of the closed loop 56 must be an integer multiple of the wavelength of t light. As such, the mode number must be a positive integer for resonance to take place. As a result, when the incident light contains multiple wavelengths, only the resonant wavelengths will be able to pass through the ring resonator 51 fully and back to the gain medium 2 via the splitter 3. As a result, only the selected wavelengths that match the resonant wavelength of the ring resonator 51 will be returned.

To return the selected wavelengths back to the gain medium 2, a loop back system may be provided, which may simply comprise a waveguide formed into a Sagnac loop 65 optically coupled to the drop port 58, as illustrated and described with reference to FIG. 3b, which returns the light back through the ring resonator 51 to the input port 52.

Alternatively, as illustrated in FIG. 3a, the loop back system may comprise a splitter 60, with a first I/O port 61 optically coupled to the second port 22, a second I/O port 62 optically coupled to the input port 53 of the input waveguide 52, and a third I/O port 63 optically coupled to the drop port 58 of the bus waveguide 57. Light travelling from the second port 22 will be split by the splitter 60 and travel along both the bus waveguide 57 and the input waveguide 52, and enter the closed loop waveguide 56 from both sides thereof. Since the ring resonator 51 is a reciprocal device, the resonant wavelength will pass through the closed loop waveguide 56 in opposite directions and end up back at the splitter 60 for coherent and constructively recombination and transmission back to the gain medium 2 via the splitter 3. Non-selected, i.e. non resonant, wavelengths will be output the first and second through ports 54 and 59.

Figure 4:
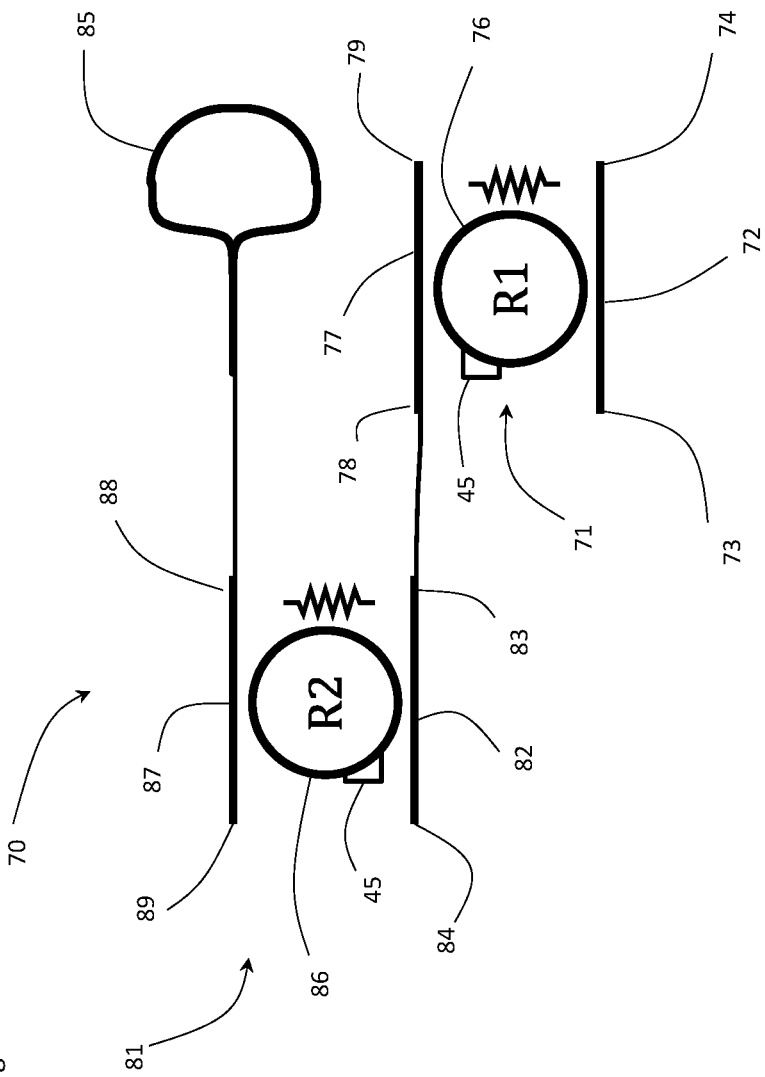
FIG. 4 is a schematic view of another embodiment of a wavelength selective reflector in accordance with the device of FIG. 1 or 2.

With reference to FIG. 4, the wavelength selective reflector 4 may comprise a comb filter, such as a ring resonator 70, with a combined FSR for passing an overlapping set of periodic wavelengths. The ring resonator 70 may comprise a first ring resonator 71 with a first FSR for passing a first set of periodic wavelengths, and a second ring resonator 81 with a second FSR different from the first FSR for passing a second set of periodic wavelengths. The first and second ring resonators 71 and 81 combine to comprise the combined FSR with the selected wavelengths comprising only the overlapping wavelengths from the first and second sets of periodic wavelengths. Accordingly, using the Vernier effect, the combined FSR is much larger than either of the first and second FSR's.

The first and second ring resonators 71 and 81 may comprise a conventional single ring resonator, a multi-ring resonator and/or a coiled racetrack resonator to minimize area and thermal effects. The first ring resonator 71 includes a input waveguide 72 with an input port 73, optically coupled to the second port 22, and a first through port 74. At least one closed loop waveguide 76 is coupled to the input waveguide 72. An output or bus waveguide 77 is coupled to an opposite side of the loop waveguide 76, and includes a drop port 78 and a second through port 79. When light of the resonant wavelengths is passed through the closed loop waveguide 76 from the input waveguide 72, it builds up in intensity over multiple round-trips due to constructive interference and is output to the output waveguide 77, which serves as a detector waveguide. Because only the select few wavelengths will be at resonance within the closed loop waveguide 76, the first ring resonator 71 functions as a filter for selected periodic wavelengths, with the light of the non-selected wavelengths exiting the first through port 74.

The drop port 78 of the first ring resonator 71 is optically coupled to the second ring resonator 81, which includes a input waveguide 82 with an input port 83, optically coupled to the drop port 78, and a first through port 84. At least one closed loop waveguide 86 is coupled to the input waveguide 82. An output or bus waveguide 87 is coupled to an opposite side of the closed loop waveguide 86, and includes a drop port 88 and a second through port 89. When light of the resonant wavelengths is passed through the closed loop waveguide 86 from the input waveguide 82, it builds up in intensity over multiple round-trips due to constructive interference and is output to the output waveguide 87, which serves as a detector waveguide. Because only the second set of wavelengths will be at resonance within the closed loop waveguide 86, the optical ring resonator 81 functions as a secondary filter for selecting only those wavelengths from the first set of wavelengths that are also in the second set of wavelengths, i.e. overlapping. The light of the non-selected wavelengths exit the first through port 84.

To return the selected wavelengths back to the gain medium 2, a loop back system may be provided, which may simply comprise a waveguide formed into a Sagnac loop 85 coupled to the drop port 88. Light entering the Sagnac loop 85 may be split into two sub-beams, which then travel in opposite directions around the Sagnac loop 85, to be recombined and transmitted sequentially back through the first and second ring resonators 71 and 81. Optically coupling bus waveguide 87 of the second ring resonator 81 to a splitter, e.g. splitter 60, may also provide the required loop back system, as hereinbefore described with reference to FIG. 3.

Figure 5:
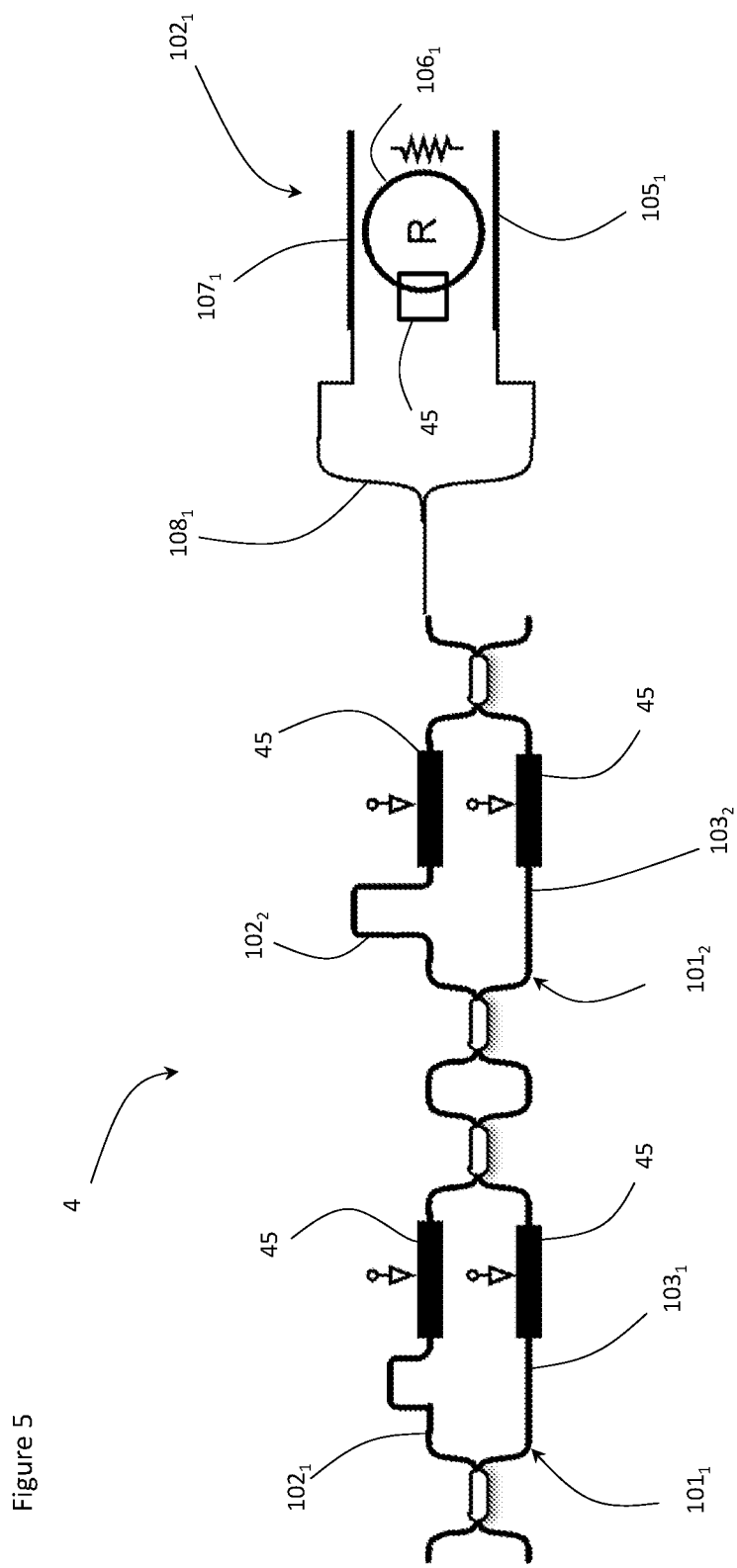
FIG. 5 is a schematic view of another embodiment of a wavelength selective reflector in accordance with the device of FIG. 1 or 2

In an alternative embodiment, illustrated in FIG. 5, the wavelength selective reflector 4 may include any combination of one or more Mach Zehnder (MZ) filters $101_1$ to $101_n$ and one or more ring resonators $102_1$ to $102_n$. Each MZ filter $101_1$ to $101_n$ includes a first 103 and a second arm 104, with a large arm imbalance, e.g. the longer arm is 30%-50% longer, and a small loss imbalance. Each of the ring resonators $102_1$ to $102_n$ includes an input waveguide 105, a closed loop waveguide 106, and a bus waveguide 107. The ring resonators $102_1$ to $102_n$ may be coupled in series, as in FIG. 4, or in parallel, as in FIG. 6. The ring resonators $102_1$ to $102_n$ may include a splitter 108 for splitting and recombining the light during a single pass, as in FIG. 3a and FIG. 6 or a Sagnac loop, as in FIG. 3b or 4, for returning the light for a double pass. Each of the one or more Mach Zehnder (MZ) filters $101_1$ to $101_n$ and one or more ring resonators $102_1$ to $102_n$ may have a different FSR, $FSR_1$ to $FSR_n$, providing a Vernier filter, as hereinbefore and hereinafter described.

Each of the ring resonators 51, 71, 81 and $102_1$ to $102_n$ and MZ filters $101_1$ to $101_n$ may include at least one phase tuning section 45, e.g. thermo-optic or electro-optic, within the closed loop waveguide 56, 76, 86 or 106 to enable the tunability of the resonant wavelengths via the controller 32. The phase tuning section 45 also should include waveguides with low back reflection and small thermal coefficient. The ring resonators 51, 71, 81 and $102_1$ to $102_n$ may also be comprised of waveguides that result in minimal thermal effects. For example: if a combination of positive and negative thermal coefficient waveguides are used. One advantage of the ring resonator devices 51, 71,81 and $102_1$ to $102_n$ is that the resonator devices 51, 71, 81 and $102_1$ to $102_n$ may be accessed both via the through port 54, 59, 74, 79, 84 and 89 and the drop ports 58, 78 and 88, which provides different signal amplitudes at high fineness section. For example, providing monitoring photodetectors optically coupled to the through ports 54, 59, 74, 79 and 84 may provide an indication of when light at the resonant wavelength of the ring resonator 51, 71, 81 and $102_1$ to $102_n$ is minimized or null at the through port 54, 59, 74, 79 and 84, and therefore fully passed to the drop port 58, 78 or 88. Accordingly, the through ports 54, 59, 74, 79 and 84 may provide an alternative location for the monitor photodetector or a secondary location for an additional photodetector providing a secondary or confirmation measurement that the ring resonator 51, 71, 81 and $102_1$ to $102_n$ is locked to the wavelength of the laser signal 26 or 126.

Figure 6:
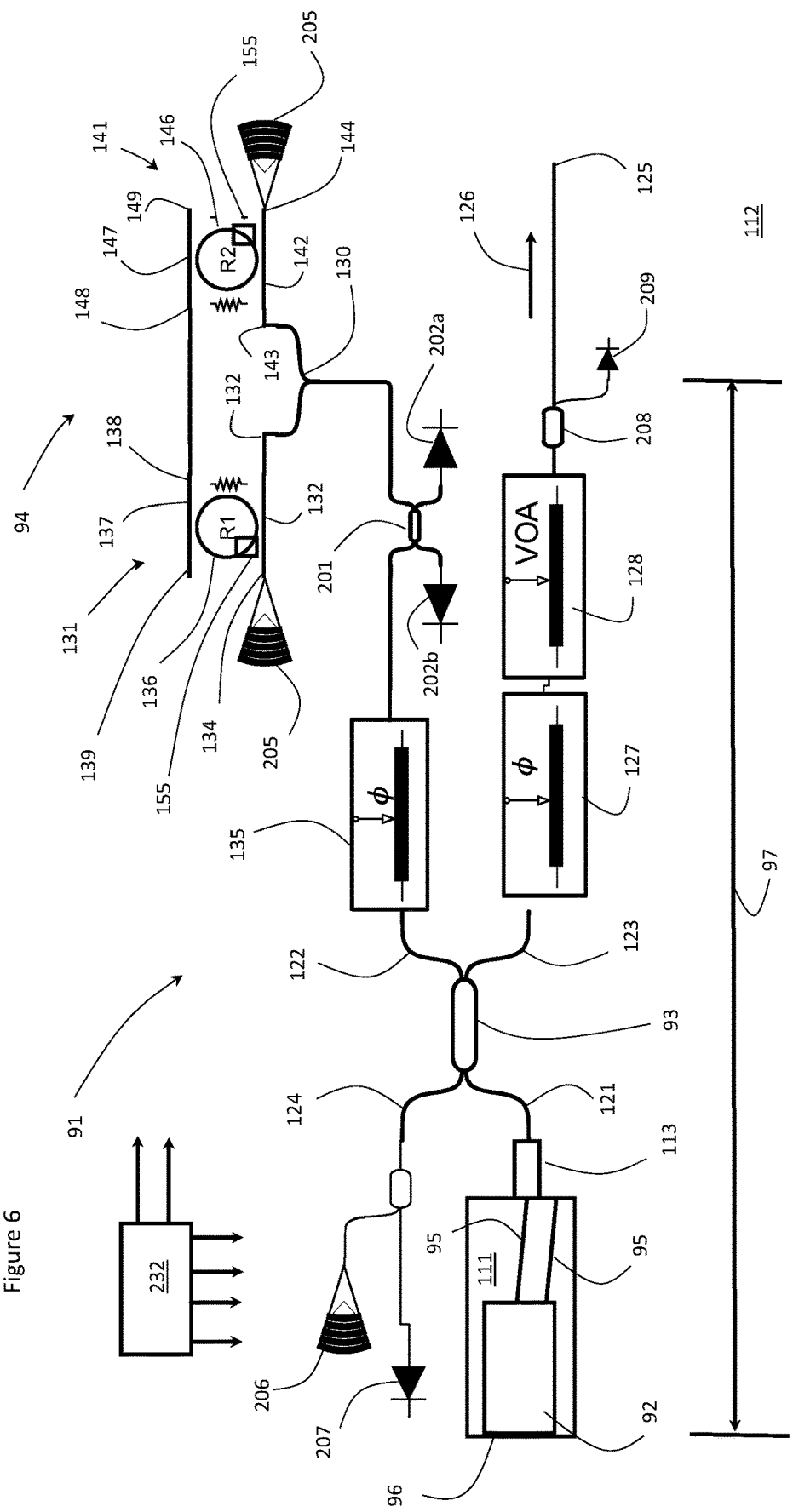
FIG. 6 is a schematic view in accordance with another embodiment of the present invention.
Figure 7A:
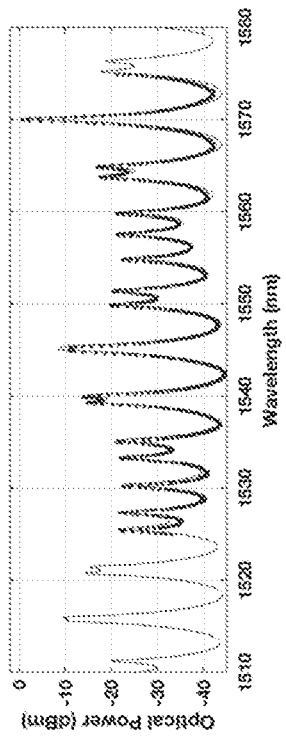
FIGS. 7a and 7b are plots of power (dB) vs wavelength (nm) for the wavelength selective reflector from the device of FIG. 5.
Figure 7B:
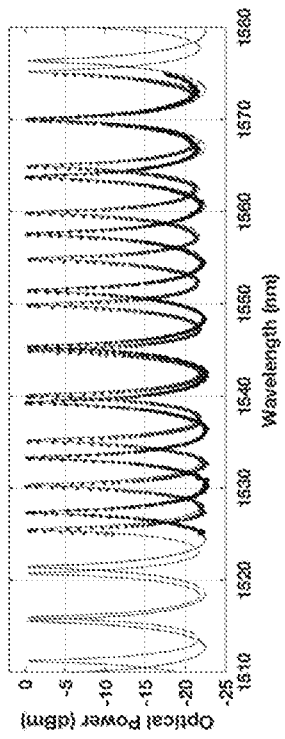

With reference to FIG. 6, another embodiment of a tunable laser 91 of the present invention comprises a gain medium 92, e.g. a passively bonded reflective semiconductor optical amplifier (RSOA), an optical coupler 93, and a wavelength selective reflector 94, e.g. a reflective external cavity comprising ring resonators provided in a photonic chip 112, e.g. a semiconductor, such as silicon or SOI.

Ideally, the gain material 92 comprises 600 μm long Indium-Phosphide (InP) multi-quantum-well (MQW) based RSOA, on a chip 111, but other gain materials are within the scope of the invention. One or more output waveguides 95 from the gain medium 92 may be angled at a small acute angle to a normal from the output facet of the gain medium 92, e.g. by 5° to 15°, ideally by 9°, and include an anti-reflection coating to reduce the back reflection at the output facet. The rear facet of the gain medium 92 may be coated with a high reflectivity (HR) coating; however, other means of providing a reflective surface, as hereinbefore described are possible. Each output waveguide 95 may be optically coupled to a different splitter 93 and wavelength selective reflector 94, in various array arrangements, similar to and including the same elements as the ones described hereinbefore and hereinafter with reference to FIGS. 1 and 2. A particular application for a dual channel embodiment is as a transmitter and a local oscillator in a coherent transceiver.

A spot sized converter (SSC) 113 may be included to provide mode-matching between the gain medium 92 and waveguides in the device layer of the photonic chip 112. The (SSC) 113 may also be angled to match the output angle of the waveguide 95 from the gain medium 92, and to further reduce reflection at the front facet. A reflective surface 96 provided on or adjacent to the gain medium 92, and the wavelength selective reflector 94 form a laser cavity 97.

Due to the large mode mismatch between the waveguide 95 (from the gain medium 92) and the waveguide in the device layer of the photonic chip 112, e.g. first port 121, an optical spot-size converter 113 may be provided in the device layer of the photonic chip 112 to reduce the coupling loss between the gain medium 92 and the photonic chip 112. The SSC 113 may use one or multiple layers of silicon nitride ($Si_3N_4$) which reduces the waveguide-to-cladding index contrast to $\Delta n \approx 0.5$ ($Si_3N_4/SiO_2$), in comparison to a standard silicon waveguide, $\Delta n \approx 2(Si/SiO_2)$. The smaller index contrast of the $Si_3N_4$ waveguide results in a larger mode, which enables greater mode matching to the mode from the gain medium 92. For example: the SSC 113 may adiabatically transforms a high confinement silicon ridge waveguide on the photonic chip 112 into the $Si_3N_4$ waveguide of the SSC 113. Alternatively or in addition, the waveguide 95 may include a tapering width and or height for expanding the mode reentering the gain medium 92 and for contracting the mode leaving the first chip 111.

The optical splitter 93 includes a first port 121 optically coupled to the gain medium 92, e.g. via the optical coupler 113, and a second port 122 optically coupled to the wavelength selective reflector 94 providing an input/output port for transmitting and receiving light to and from the wavelength selective reflector 94. A third port 123 provides an output port for the ECL 91, which may be optically coupled to additional optical elements in the device layer of the photonic chip 112 and/or to an edge of the photonic chip 112, e.g. laser output port 125, for outputting a laser signal 126 to an external waveguide. A fourth port 124 may be provided for monitoring purposes. The optical coupler 93, e.g. a directional coupler (DC), may be connected to the SSC 113 in order to split a first percentage, e.g. 25%-50%, ideally 35%-40%, of the power to the laser output port 125, and a second percentage, e.g. 50%-75%, ideally, 60%-65% (or −2 dB) to the wavelength selective reflector 94. The coupling ratio may be optimized to trade for higher laser power.

Grating couplers 206 or other suitable devices, such as photodetectors 207, may be provided optically coupled to the fourth port 124 for wafer level testing optical monitoring and/or control. The grating couplers 206 and photodetectors may be connected to a controller 232 or some other external monitor or control system.

To further control the output laser signal 26 or 126, an additional phase tuning device 127 and/or a variable optical attenuator 128 may be provided between the third port 23 or 123 and the laser output port 25 or 125, in particular to control the phase and amplitude of back reflected light. Grating couplers or other suitable device, e.g. tap 208 and photodetector 209, may be provided optically coupled between the third port 23 or 123 and the laser output port 25 or 125 for wafer level testing optical monitoring and/or control. The grating couplers or photodetectors 209 may be connected to the controller 32 or 232 or some other external monitor or control system.

The wavelength selective reflector (WSR) 94 may comprise a dual-ring Vernier filter at the end of the external cavity 97 to form a tunable filter with wide tuning range. However, any of the aforementioned WSR, e.g. 51 or 70, may also be used. The dual-ring structure comprises a first ring resonator 131, and a second ring resonator 141 connected to first and second arms, respectively, of a Y-junction 130. Compared to dual-ring designs with Sagnac loop mirror at the end, e.g. FIG. 4, light travels in the WSR 94 only once, reducing the round-trip loss by a half and hence increasing the feedback amplitude. A phase tuner 135 may be included before the WSR 94 to fine-tune the longitudinal mode of the laser cavity 97, in order to control mode hop behavior. Between the WSR 94 and phase tuner 135, a tap 201, e.g. a 2% DC tap, may be provided with monitoring photodetectors (MPD) 202a and 202b for monitoring the feedback in both directions within the external cavity 97 via the controller 232, as hereinbefore described. For exemplary purposes only, a total routing waveguide length of on the photonics chip 112 is approximately 1100 m, which results in the simulated longitudinal laser mode spacing of ~0.18 nm.

The first and second ring resonators 131 and 141 may comprise a conventional single ring resonator, a multi-ring resonator and/or a coiled racetrack resonator to minimize area and thermal effects. The first ring resonator 131 includes a input waveguide 132 with an input port 133, optically coupled to the first arm of the Y-junction 130, and a first through port 134. At least one closed loop waveguide 136 is coupled to the input waveguide 132. An output or bus waveguide 137 is coupled to an opposite side of the loop waveguide 136, and includes a drop port 138 and a second through port 139. When light of a first set of resonant wavelengths is passed through the closed loop waveguide 136 from the input waveguide 132, they build up in intensity over multiple round-trips due to constructive interference and is output to the output waveguide 137, which serves as a detector waveguide. Because only the select few wavelengths will be at resonance within the closed loop waveguide 136, the first ring resonator 131 functions as a filter for selected periodic wavelengths, with the light of the non-selected wavelengths exiting the first through port 134.

The second arm of the Y-junction 130 is optically coupled to the second ring resonator 81, which includes a input waveguide 142 with an input port 143, optically coupled to the drop port 78, and a first through port 84. At least one closed loop waveguide 146 is coupled to the input waveguide 142. An output or bus waveguide 147 is coupled to an opposite side of the closed loop waveguide 146, and includes a drop port 148 connected to the drop port 138, and a second through port 149. When light of the second set of resonant wavelengths is passed through the closed loop waveguide 146 from the input waveguide 142, they buildup in intensity over multiple round-trips due to constructive interference and are output to the output waveguide 147, which serves as a detector waveguide.

Light travelling from the second port 122 will be split by the splitter 130 and travel along both the input waveguides 132 and 142, and enter the closed loop waveguides 136 and 146. The first set of selected wavelengths may then pass from the drop port 138 of the bus waveguide 137 to the drop port 148 of the bus waveguide 147, while the second set of selected wavelengths pass from the drop port 148 of the bus waveguide 147 to the drop port 138 of the bus waveguide 137 for a return trip via the other ring resonator 131 or 141. Because only first set of wavelengths will be at resonance within and pass through the first ring resonator 131, and only the second set of wavelengths will be at resonance within and pass through the second ring resonator 141, the first and second ring resonators 131 and 141 functions as secondary filters for selecting only those wavelengths from both the first set of wavelengths and the second set of wavelengths, i.e. overlapping. Since the ring resonators 131 and 141 are reciprocal devices, the resonant wavelengths will pass through the closed loop waveguides 136 and 146 in opposite directions and end up back at the Y-junction 130 for coherent and constructively recombination and transmission back to the gain medium 92 via the splitter 93

The light of the non-selected wavelengths exit the first through ports 134 and 144 and/or the second through ports 139 and 149, Grating couplers 205 or other suitable devices may be provided optically coupled to the first through ports 134 and 144 and/or the second through ports 139 and 149 for wafer level testing optical monitoring and/or control. The grating couplers 205 may be connected to the controller 232 or some other external monitor or control system.

In an exemplary embodiment, the first ring resonator 131 may include a bend radius of 20 μm (R1) and an FSR of 4.99 nm near 1550 nm. The measured Q-factor is 5500. The second ring resonator 141 may include a bend radius of 16.3 μm (R2) and an FSR of at least 20% more, e.g. 6.13 nm near 1550 nm. The measured Q-factor is 4800. The Vernier ring reflected spectrum is plotted in FIG. 6. When the rings reflection is aligned at 1570 nm, the side mode extinction is larger than 8 dB across a 60 nm range (1510 nm-1570 nm), more than sufficient to operate over the entire C-band. Q-factor of the highest peak (where threshold condition is met) is about 8000.

Example Fabrication Process

The photonic chip 12 or 112 may be fabricated using a complementary metal-oxidesemiconductor (CMOS) processes. The substrate may be any suitable material, although silicon or an SOI wafer with a 220-nm device layer is preferred. Front end etching and doping processes are used to build the waveguides and active components, e.g. one or more splitters 3 and 93 and one or more wavelength selective reflectors 4 or 94. Silicon nitride or other suitable material may be deposited and patterned in the backend to form the spot size converter 13 or 113 to the gain medium chip 2 or 92, as well as a hard stop layer for vertical alignment.

A wafer of chips 111 for the gain medium 2 or 92, e.g. InP RSOA, may be fabricated using a standard III-V processing technique. A series of etches may be used to defined a hard stop at any suitable layer, e.g. an MQW layer, as well as a contact pad, e.g. recessed gold, for bonding with corresponding locations of these features and bonding pads matching that of the photonic chip 12 or 112. The gain medium wafer may then be cleaved into bars, which may be HR coated, e.g. >90%, on the backside and anti-reflectivity (AR) coated on the front side, to a desired index, e.g. 1.45. The bars may then be cleaved into chips 111 comprising one or more, e.g. two, channels each.

Integration of the chip 111 with the one or more gain mediums 2 or 92 onto the photonic chip 12 or 112 may be accomplished using a high-precision thermo-compression bonder with a desired placement accuracy, e.g. 0.5 μm. Vertical alignment of each gain medium chip 111 may be accomplished using the hard stop features on the photonic chip 12 or 112 and the gain medium chip 11 or 111, while angular and planar alignments were accomplished using the bonder's vision system, which utilized alignment features defined on both chips 11, 111 and 12, 112.

The investigated device can be tuned across C-band for any ITU channel. FIG. 5(*a*) shows the L-I-V (Light-Current-Voltage) curve of the laser with the lasing wavelength at 1546.88 nm (193.8 THz). The lasing threshold is observed at 30 mA. Wall-plug efficiency (WPE) can be determined by dividing the on-chip power by the amount of power going into driving the RSOA chip. As shown in FIG. 5(*b*) the ECL achieves peak WPE of 4.2% around and injection current of 90 mA.

A major challenge for III-V/semiconductor hybrid external cavity lasers is overcoming wavelength drift and mode-hopping during the life. Typically, the lasing wavelength is seen to drift until it mode hops to the next longitudinal mode. Additionally, the wavelength drift before the mode-hop (or between the two mode hops) is larger than laser longitudinal mode spacing. A possible reason is that as the gain material current increases, not only the gain material temperature increase, but also the device layer (semiconductor) temperature slightly increase resulting in red-shifted ring wavelengths. Both wavelength drift and mode-hopping may be prevented by aligning the ring resonators, e.g. 131 and 141, and phase sections 135 at the given injection current.

The first and second ring resonators, e.g. 131 and 141, and the phase shift element 135 may be tuned for every current data point, using thermal phase tuners 155 on each of the first and second ring resonators 131 and 141. The biases for the wavelength selective reflector 4 or 94, e.g. ring resonators 131 and 141, are initially set to power values corresponding to the selected wavelengths. Aligned ring resonators 131 and 141 at desired wavelength results in maximum reflectivity and hence maximum power on the monitoring photo detectors 202*a* and 202*b*. The ring resonators 131 and 141 are hence aligned with each other by maximizing the photocurrent reading on the monitoring photo detectors 202*a* and 202*b*. The laser cavity phase tuner 135 is then scanned and set to a value that biases the laser longitudinal mode to the center double ring resonance, which keeps the lasing mode away from mode-hop regions. However, the tuning the phase tuner 135 may cause the lasing wavelength to drift, consequently requiring further adjustment of the biases of the ring resonators 131 and 141. This procedure is iteratively repeated until the measured wavelength matches the target wavelength. For this procedure, an optical spectrum analyzer (OSA) may be used to monitor the lasing wavelength as the injection current is increased. This method enables the lasing peak around the desired wavelength to be tuned and maintained to within OSA's resolution of 0.02 nm for every injection current, corresponding to tuning accuracy of +/−1.25 GHz in frequency. Such accuracy is within the tolerance needed in most communications applications (+/−2.5 GHz).

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An external cavity laser comprising:
   a gain medium for generating light;
   a first reflector at one end of the gain medium with greater than 90% reflectivity;
   a coupler including an input port, an input/output port, and an output port, the input port optically coupled to the gain medium, wherein the coupler is configured to split the light from the gain medium into input laser light directed to the input/output port, and output laser light directed to the output port;
   a wavelength selective reflector optically coupled to the input/output port forming a laser cavity with the first reflector, and configured for returning the input laser light at a selected wavelength back to the gain medium via the input/output port, and passing non-selected light at non-selected wavelengths, wherein the coupler is also configured for directing the input laser light at the selected wavelength returning from the wavelength selective reflector to the gain medium;
   a first phase tuner between the coupler and the wavelength selective reflector configured for tuning an optical cavity length of the optical cavity;
   a second phase tuner configured for tuning the selected wavelength reflected by the wavelength selective reflector; and
   a controller configured for controlling the first phase tuner and the second phase tuner to align the optical cavity length of the optical cavity with the wavelength selective reflector, and thereby control the selected wavelength of the output laser light.

2. The external cavity laser according to claim 1, wherein the wavelength selective reflector comprises a first comb filter including a first FSR configured for passing a first set of periodic wavelengths including the light at the selected wavelength, and returning the light at the selected wavelength to the input/output port.

3. The external cavity laser according to claim 2, wherein the first comb filter comprises a first ring resonator including the first FSR configured for passing the input laser light at the selected wavelength to a drop port and passing the non-selected light of the non-selected wavelengths to a through port; and
   a loop back optically coupled to the drop port for returning the input laser light at the selected wavelengths to the first ring resonator for return to the input/output port.

4. The external cavity laser according to claim 2, wherein the first comb filter comprises:
   a Y-splitter including a first port optically coupled to the first phase tuner; a second port coupled to the first port; and a third port coupled to the first port;
   a first ring resonator including the first FSR, a resonator input port optically coupled to the second port, and a drop port optically coupled to the third port;
   wherein the input laser light passing from the second port through the first ring resonator via the resonator input port to the drop port at the selected wavelength returns back to the first port via the third port, and input laser light passing from the third port through the first ring resonator via the drop port to the resonator input port at the selected wavelength returns back to the first port via the second port.

5. The external cavity laser according to claim 2, wherein the first comb filter comprises:
   a first ring resonator including a second FSR configured for passing the input laser light at a second set of periodic wavelengths including the selected wavelength to a first drop port and passing the non-selected light at the non-selected wavelengths to a first through port;
   a second ring resonator including a third FSR different than the second FSR, configured for passing a third set of periodic wavelengths including the selected wavelength to a second drop port, whereby the first ring resonator and the second ring resonator, in combination, comprise the first FSR with the first set of periodic wavelengths including the selected wavelength, which comprises an overlapping wavelength from the first set of periodic wavelengths and the second set of periodic wavelengths; and
   a loop back optically coupled to the second drop port for returning the input laser light at the selected wavelength to the first ring resonator via the second ring resonator for return to the input/output port.

6. The external cavity laser according to claim 2, wherein the first comb filter comprises:
   a Y-splitter including a first port optically coupled to the; a second port coupled to the first port;
   and a third port coupled to the first port;
   a first ring resonator coupled to the second port including a second FSR configured for passing a second set of periodic wavelengths including the selected wavelength to a bus waveguide; and
   a second ring resonator coupled to the third port including a third FSR different than the second FSR, configured for passing a third set of periodic wavelengths including the selected wavelength to the bus waveguide;
   wherein the second set of periodic wavelengths is passed to the second ring resonator, and the third set of periodic wavelengths is passed to the first ring resonator; whereby the first ring resonator and the second ring resonator combine to comprise the first FSR including the selected wavelength comprising an overlapping wavelength from the second set of periodic wavelengths and the third set of periodic wavelengths.

7. The external cavity laser according to claim 6, wherein the third FSR is at least 20% greater than the second FSR.

8. The external cavity laser according to claim 6, wherein the second phase tuner comprising a first phase tuning section for tuning the second FSR of the first ring resonator, and a second phase tuning section for tuning the third FSR of the second ring resonator.

9. The external cavity laser according to claim 5, wherein the second phase tuner comprising a first phase tuning section for tuning the second FSR of the first ring resonator, and a second phase tuning section for tuning the third FSR of the second ring resonator.

10. The external cavity laser according to claim 1, further comprising a third phase tuner optically coupled to the output port configured to control phase of back reflected light from the output laser light.

11. The external cavity laser according to claim 1, wherein the coupler is configured for splitting the light from the gain medium into a first percentage of power between 25%-50% to the output port, and a second percentage, between 50%-75% to the wavelength selective reflector.

12. The external cavity laser according to claim 1, wherein the coupler and the wavelength selective reflector are integrated into a device layer of a photonic chip; and
wherein the gain medium is integrated into a gain medium chip placed in a pit in the photonic chip.

13. The external cavity laser according to claim 12, wherein the gain medium chip includes an output waveguide optically coupled to the input port, and angled at an acute angle to a normal from an output facet of the gain medium for minimizing back reflection into the gain medium.

14. The external cavity laser according to claim 13, wherein the acute angle is between 5° to 15°.

15. The external cavity laser according to claim 12, further comprising an optical spot-size converter provided in the device layer of the photonic chip to reduce coupling loss between the gain medium and the photonic chip.

16. The external cavity laser according to claim 15, wherein the optical spot-size converter comprises at least one layer of silicon nitride ($Si_3N_4$) providing a reduced waveguide-to-cladding index contrast compared to the device layer, resulting in a larger mode, providing mode-matching between the gain medium and the photonic chip.

17. The external cavity laser according to claim 2, wherein the first comb filter comprises:
at least one Mach Zehnder (MZ) filter; and
at least one ring resonator filter;
wherein each of the MZ filters and the ring resonator filters has a different FSR, which combine to comprise the first FSR.

18. The external cavity laser according to claim 17, further comprising a Sagnac loop for returning the selected wavelength back through the first comb filter and to the gain medium via the coupler.

19. The external cavity laser according to claim 17, further comprising a Y-junction optically coupled to the at least one ring resonator for splitting the input laser light and recombining the input laser light.

20. The external cavity laser according to claim 1, further comprising:
first and second output waveguides extending from the gain medium, the first output waveguide optically coupled to the input port;
an additional splitter including an additional input port optically coupled to the gain medium, an additional input/output port, and an additional output port for outputting additional laser light at an additional selected wavelength; and
an additional wavelength selective reflector optically coupled to the additional input/output port for reflecting light of the additional selected wavelength back to the gain medium via the additional input/output port forming an additional laser cavity with the first reflector, and passing light of additional non-selected wavelengths.

* * * * *